United States Patent
La Rosa

(10) Patent No.: US 6,738,286 B2
(45) Date of Patent: May 18, 2004

(54) EEPROM MEMORY COMPRISING MEANS FOR SIMULTANEOUS READING OF SPECIAL BITS OF A FIRST AND SECOND TYPE

(75) Inventor: Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/277,183

(22) Filed: Oct. 21, 2002

(65) Prior Publication Data

US 2003/0090936 A1 May 15, 2003

(30) Foreign Application Priority Data

Oct. 22, 2001 (FR) .............................. 01 13635

(51) Int. Cl.[7] .............................................. G11C 16/04
(52) U.S. Cl. ............................ 365/185.01; 365/185.05
(58) Field of Search ...................... 365/185.01, 185.05, 365/185.18, 185.23, 185.33

(56) References Cited

U.S. PATENT DOCUMENTS 5,815,458 A * 9/1998 Chevallier et al. ..... 365/230.06
5,991,194 A   11/1999 Jigour et al. ........... 365/185.04
6,418,058 B1 * 7/2002 Sakui et al. ............ 365/185.22

FOREIGN PATENT DOCUMENTS

EP  0443775  8/1991  .......... G11C/16/06
EP  1085521  3/2001  .......... G11C/16/22

* cited by examiner

Primary Examiner—Anh Phung
(74) Attorney, Agent, or Firm—Lisa K. Jorgenson; Allen, Dyer, Doppelt, Milbrath & Gilchrist, P.A.

(57) ABSTRACT

An electrically erasable and programmable memory (EEPROM) includes a memory array containing memory cells connected to word lines arranged in rows and to bit lines arranged in columns. The memory array includes a first special zone for storing special bits of a first type, and a second special zone for storing special bits of a second type. The first special zone includes a first row of memory cells connected to a first word line, wherein N1 memory cells are connected to N1 bit lines of a determined column of the memory array. The second special zone includes a second row of memory cells connected to a second word line, wherein N2 memory cells are connected to N2 other bit lines of the determined column. The N1 bit lines are not connected to the second row of memory cells, and the N2 bit lines are not connected to the first row of memory cells.

27 Claims, 3 Drawing Sheets

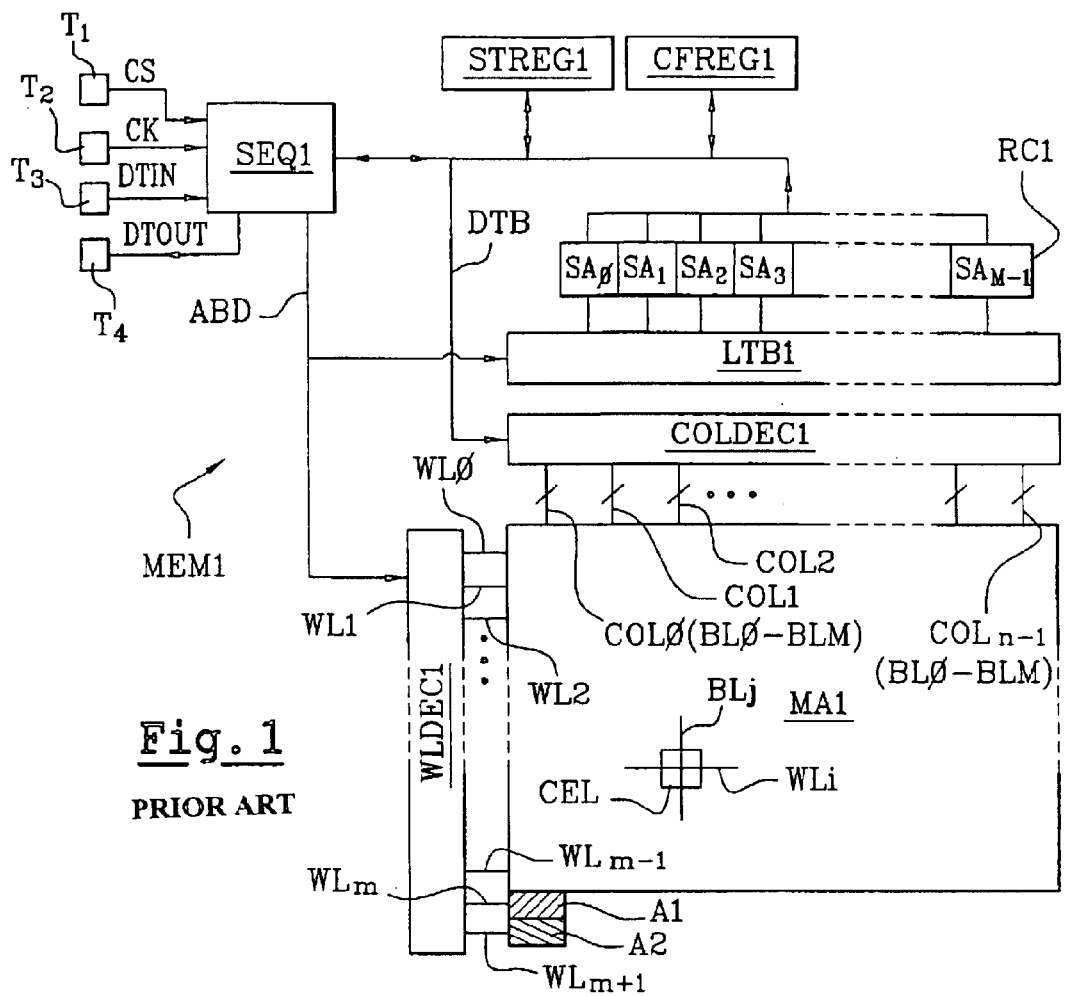
Fig. 1
PRIOR ART
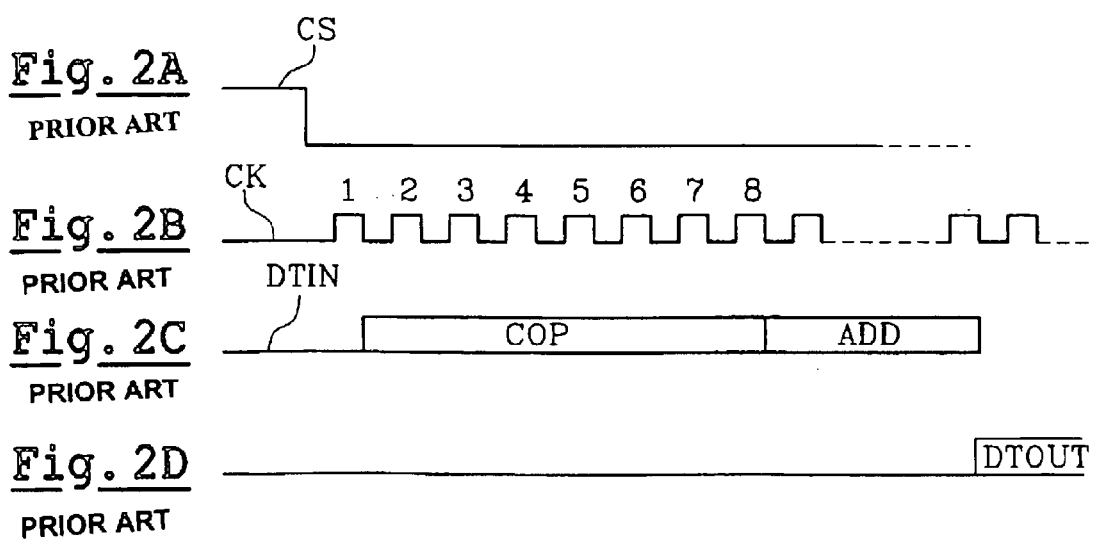
Fig. 2A PRIOR ART
Fig. 2B PRIOR ART
Fig. 2C PRIOR ART
Fig. 2D PRIOR ART

EEPROM MEMORY COMPRISING MEANS FOR SIMULTANEOUS READING OF SPECIAL BITS OF A FIRST AND SECOND TYPE

FIELD OF THE INVENTION

The present invention relates to electrically erasable and programmable memories (EEPROMS), and in particular, to a EEPROM series memory (i.e., a memory with a series input/output or with a series input). The present invention more particularly relates to reading and storing in an EEPROM special bits, such as condition bits and configuration bits.

BACKGROUND OF THE INVENTION

FIG. 1 represents a conventional series memory MEM1 comprising a memory array MA1 of electrically erasable and programmable memory cells CEL connected to word lines WLi and to bit lines BLj. The memory array MA1 comprises m word lines $WL_0$ to $WL_{m-1}$ and n columns $COL_0$ to $COL_{n-1}$, with each column comprising M bit lines $BL_0$ to $BL_{M-1}$. Selection of the memory cells for reading or writing is carried out by a decoder WLDEC1 connected to the word lines WLi, and a decoder COLDEC1 connected to the bit lines. The writing of data is performed by programming latches LTB1 connected to the columns via the decoder COLDEC1, while the data is read by a reading circuit RC1. The circuit RC1 comprises M sense amplifiers $SA_0$ to $SA_{M-1}$ enabling simultaneous reading of M memory cells belonging to a column selected by the decoder COLDEC1 and to a line selected by the decoder WLDEC1.

These diverse elements are driven by a sequencer SEQ1 connected by a data bus DTB to the outputs of the circuit RC1 and to the inputs of the latches LTB1. An address bus ABD connects these elements to the decoders COLDEC1 and WLDEC1. The sequencer SEQ1 is connected to terminals T1, T2, T3 and T4 for receiving or transmitting signals described below.

The memory MEM1 also comprises two registers STREG1 and CFREG1, which are volatile type registers. The register STREG1 contains special bits of a first type, for example, protection bits of the memory array. These bits are to be preserved outside the periods of utilization of the memory, and a special zone A1 is provided in the memory array to store them in a non-volatile fashion. The special zone A1 of the memory array is, for example, connected to an additional word line $WL_m$ added to the m word lines of the memory array.

The register CFREG1 contains special bits of a second type, for example, configuration bits acting on certain elements of the memory. This register is used by the manufacturer to set up the memory during a test and adjustment phase before marketing. The parameters that can be adjusted due to the configuration bits are quite varied and include the following: the level of a program erasing high voltage Vpp; the level of a gate control voltage during the reading phases; the number of current generators activated in the sense amplifiers; current adjustment in the current generators; and the durations of certain internal delays, for example.

Since the configuration bits may also be preserved when the memory is switched off, a special zone A2 is dedicated to them in the memory array. The zone A2 is, for example, connected to a second additional word line $WL_{m+1}$.

Conventionally, the register STREG1 is read accessible and the memory zone A1 is write accessible by applying to the memory special instructions in the form of operating codes. The memory zone A2 is moreover read and write accessible by applying to the memory operating codes that are generally not communicated to the user and remain exclusive to the manufacturer. The user is not supposed to be aware of the existence of configuration bits.

Such a memory should be suitably equipped to read the zone A2 before performing a first instruction. This is because the configuration bits define the operation of the memory, and must be loaded into the register CFREG1 for the configuration to be effective before performing the first instruction. For reasons explained below, the zone A1 must also be read before performing a first instruction, and the condition bits must be loaded into the register STREG1.

With respect to FIGS. 2A to 2D, the execution of a first instruction after activation of the memory, for example, an instruction for reading the memory array, will now be considered. FIG. 2A represents a selection signal CS (chip select) applied to the terminal T1. FIG. 2B represents clock signals applied to the terminal T2. FIG. 2C represents data DTIN applied to the terminal T3. FIG. 2D represents data DTOUT delivered by the sequencer on the terminal T4, either data read in the memory array or in the registers. The signal CS is set to 0 to activate the memory and the clock signal CK is then applied to the terminal T2. As of the first clock cycle, data DTIN is applied to the terminal T3. This data comprises an operating code COP, containing generally 8 bits, such as a code relating to a reading operation, then address bits ADD.

After having received the operating code and the address bits, the sequencer SEQ1 can read the memory zone affected and deliver the data DTOUT. During the reception of the address bits, the sequencer has enough time to decode the operating code. However, if the first operating code received is an instruction for reading the register STREG1, this code is not provided with address bits. If it is expected that all the code bits are received to execute the instruction, i.e., in this case the eighth clock cycle, the content of the zone A1 must be read into the memory array, loaded in the register STREG1, then delivered to the terminal T4 within a very short time. This is typically equal to 0.5 or 1.5 clock cycles according to the series communication protocol used.

Reading the zone A1 before the execution of the first instruction enables the condition bits to be loaded into the register STREG1, and to deliver them on the series output of the memory if the first instruction received is an instruction for reading the register STREG1. Thus, the condition bits and the configuration bits must be read in the zones A1, A2 and loaded in their respective registers before the execution of a first instruction, i.e., during the reception of the first clock signals.

The time conferred upon the sequencer for both these successive reading operations corresponds in theory to eight clock cycles. The first clock cycles are necessary for the stabilization of reference circuits intervening in the reading of the memory array, and the effective time available to the sequencer is greatly reduced. This time is sufficient with slow clock frequencies, but is currently becoming critical due to the increase in the clock frequencies, notably with clock frequencies equal to or greater than 20 MHz.

SUMMARY OF THE INVENTION

In view of the foregoing background, the present invention is based upon the practical observation that the sum of the bits of the first type and of the second type is generally smaller than or equal to M, with M being the number of bit lines per column, so that M sense amplifiers provided in a memory to read the M memory cells of a selected column may be enabled to read simultaneously the condition bits and the configuration bits.

For example, diverse memories marketed by the current assignee of the present invention comprise 3 condition bits and 5 configuration bits. The three condition bits comprise a bit for write-protection of the memory array (bit Write Enable) and two additional bits forming a code determining the fraction of the write-enable memory array (25, 50, 75 or 100% of the memory array). The five configuration bits form a configuration code offering $2^5$ possibilities for setting up a memory.

The present invention includes reading simultaneously the bits of the first type and of the second type. The bits of the first type and of the second type cannot be arranged on the same word line, since erasing bits of the first type would erase bits of the second type and vice-versa.

The present invention thus relates to enabling a simultaneously reading of at least two special zones in which are recorded special bits of two distinct types that cannot be erased simultaneously. To obtain this feature, the present invention also provides two special zones that are connected to two distinct word lines, but whose connections to bit lines are such that they enable a simultaneous reading of certain memory cells present in each of the zones.

More particularly, the present invention provides an electrically erasable and programmable memory comprising a memory array comprising memory cells connected to word lines and to bit lines, with the bit lines being arranged in columns. The memory array comprises at least a first special zone for storing special bits of a first type, and at least a second special zone for storing special bits of a second type.

The first special zone comprises at least a first row of memory cells connected to a first word line, wherein N1 memory cells are connected to N1 bit lines of at least a set column of the memory array comprising M bit lines. The second special zone comprises at least a second row of memory cells connected to a second word line, wherein N2 memory cells are connected to N2 other bit lines of the set column of the memory array. The N1 bit lines of the set column that are connected to the N1 memory cells of the first row are not connected to the memory cells of the second row, and the N2 bit lines of the set column that are connected to the N2 memory cells of the second row are not connected to memory cells of the first row.

According to one embodiment, N2=M−N1. The first row may comprise M memory cells connected to the first word line, and the second row may comprise M memory cells connected to the second word line. The memory may also comprise means for simultaneously applying a reading voltage to the first and second rows of memory cells when reading special bits.

The memory may comprise at least M sense amplifiers for simultaneously reading N1 memory cells of the first row and N2 memory cells of the second row. The memory may further comprise a first register for temporary storage of the special bits of the first type read in the memory cells of the first row, and a second register for temporary storage of the special bits of the second type read in memory cells of the second row.

The memory may further comprise a sequencer to automatically trigger a simultaneous reading of special bits of the first and second types during the reception of first clock signals. The special bits of the first type may be condition bits whose value determines the write-accessibility of the memory array, in whole or in part. The special bits of the second type may be configuration bits whose value determines the hardware configuration of certain elements of the memory.

The present invention is also directed to a process for storing and reading special bits of a first type and of a second type in an electrically erasable and programmable memory. The memory comprises a memory array comprising memory cells connected to word lines and to bit lines, with the bit lines being arranged in columns.

The process comprises operations that provide in the memory array at least a first special zone comprising at least a first row of memory cells connected to at least a first word line, wherein N1 memory cells are connected to N1 bit lines of at least a set column of the memory array comprising M bit lines. At least a second special zone is provided in the memory array comprising at least a second row of memory cells connected to at least a second word line, wherein N2 memory cells are connected to N2 other bit lines of the set column of the memory array. The N1 bit lines of the set column that are connected to the N1 memory cells of the first row are not connected to memory cells of the second row, and the N2 bit lines of the set column that are connected to the N2 memory cells of the second row are not connected to memory cells of the first row.

According to one embodiment, N2=M−N1. The first row may comprise M memory cells connected to the first word line, and the second row may comprise M memory cells connected to the second word line. Both rows of cells can be read simultaneously. The special bits of the first type may be condition bits whose value determines the write-accessibility of the memory array. The special bits of the second type may be configuration bits whose value determines the hardware configuration of certain elements of the memory.

BRIEF DESCRIPTION OF THE DRAWINGS

These objects, characteristics and advantages as well as others of the present invention will be explained in more detail in the following description of a memory according to the invention, non-limiting in relation to the appended figures among which:

FIG. 1 represents a conventional series memory according to the prior art;

FIGS. 2A to 2D are timing diagrams illustrating the execution of a first instruction according to the prior art;

DETAILED DESCRIPTION OF THE PREFERRED EMBODIMENTS

Figure 3:
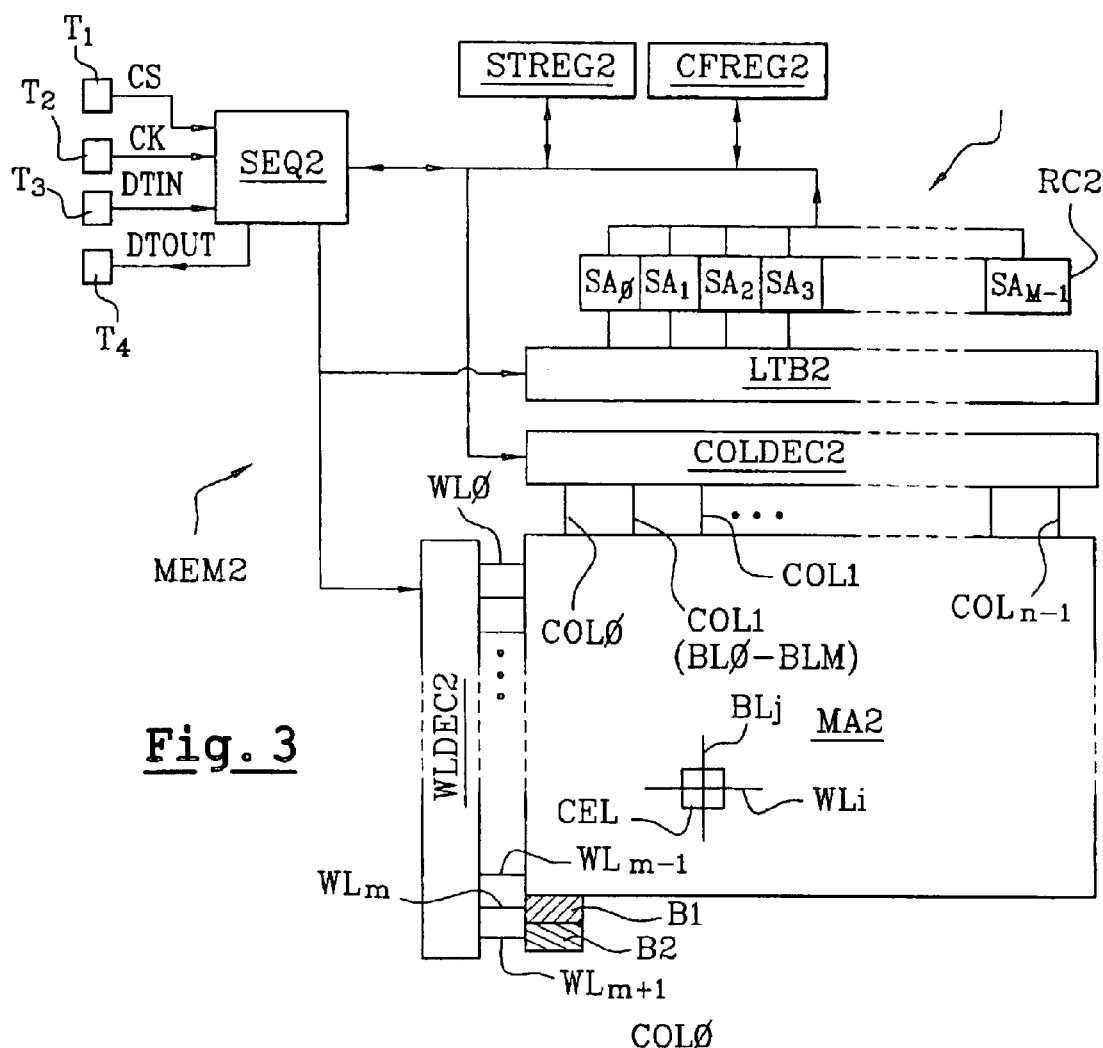
FIG. 3 represents a memory according to the present invention.

FIG. 3 represents a EEPROM memory MEM2 according to the invention. The general architecture of the memory MEM2 is identical to that of the memory MEM1 described in the background section. The memory MEM2 thus comprises a memory array MA2, with memory cells CEL connected to word lines WLi and to bit lines BLj. The memory array MA2 comprises m word lines $WL_0$ to $WL_{m−1}$ and n columns $COL_0$ to $COL_{n-1}$, with each column comprising M bit lines $BL_0$ to $BL_{M-1}$. The selection of cells for reading or for writing is performed by a word line decoder WLDEC2 and by a column decoder COLDEC2. Data is written by programming latches LTB1 connected to the columns via the column decoder. Data is read by a reading circuit RC2 comprising M sense amplifiers $SA_0$ to $SA_{M-1}$ for enabling simultaneous reading of M memory cells.

A wired logic sequencer SEQ2 or a microprocessor is connected by a data bus DTB to the outputs of the circuit RC2 and to the inputs of the latches LTB1 and by an address bus ADB to the decoders COLDEC2 and WLDEC2. The sequencer SEQ2 is connected to terminals T1, T2, T3 to receive the signals CS, CK and DTIN (instruction codes and addresses) as described above in the background section and to a terminal T4 to deliver data DTOUT.

The memory MEM2 also comprises registers STREG2 and CFREG2 of the volatile type. These registers respectively contain special bits of a first type and of a second type, for example, condition bits (for protecting the memory array) and configuration bits. Special zones B1, B2 are provided in the memory array for storing these bits. The zone B1 is, for example, connected to an additional word line $WL_m$ and the zone B2 is connected to a word line $WL_{m+1}$.

The memory MEM2 differs from the conventional memory MEM1 by a particular structure of the special zones B1, B2, which can be read simultaneously and are erasable independently from one another. The memory MEM2 also differs from the memory MEM1 in that the word line decoder WLDEC2 is arranged to select the word lines $WL_m$ and $WL_{m+1}$ simultaneously during a reading operation.

Figure 4:
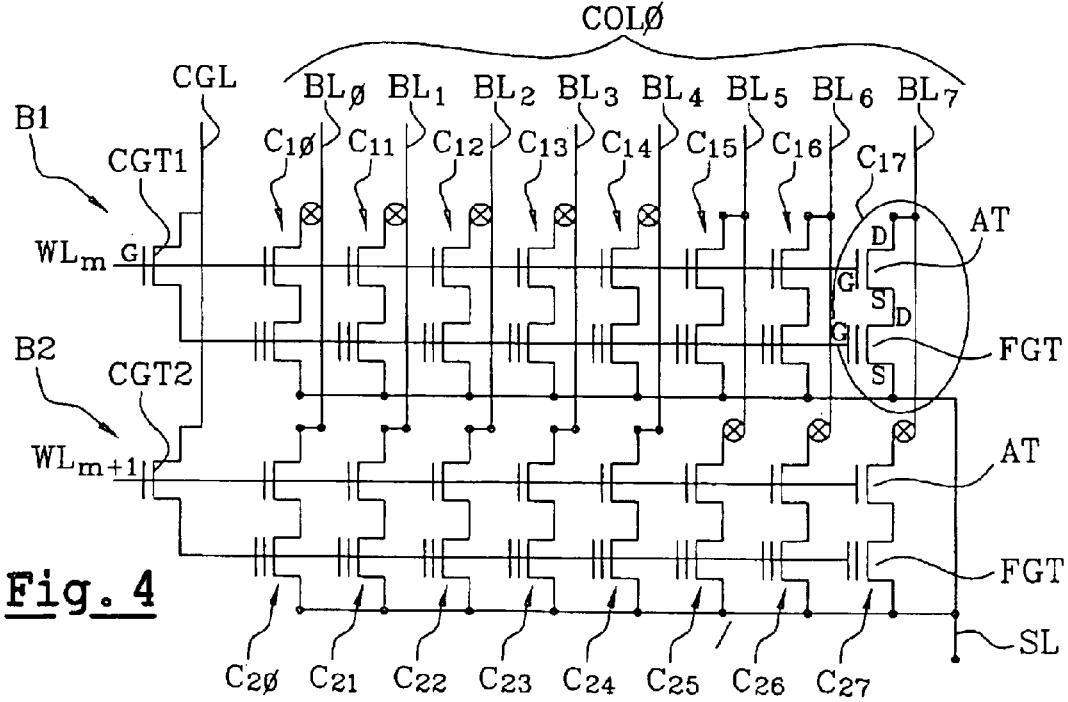
FIG. 4 represents the architecture of two special zones according to the present invention provided in the memory illustrated in FIG. 3.

An example architecture of the zones B1 and B2 is represented in FIG. 4. The memory cells of the zones B1, B2 are connected to the bit lines of a column of the memory array, for example, the first column COL0. For simplification purposes of the diagram, it is considered that each column comprises eight bit lines $BL_0$ to $BL_7$ (M=8). The reading circuit RC2 comprises in such a case eight sense amplifiers $SA_0$ to $SA_7$ enabling simultaneous reading of eight memory cells.

The zone B1 comprises eight memory cells C10 to C17 connected to the word line $WL_m$. Each memory cell comprises conventionally a floating-gate transistor FGT and an access transistor AT. In each memory cell, the transistor FGT has its source S connected to a source line SL, its drain D connected to the source S of the access transistor AT and its gate G connected to a gate control line CGL via a gate control transistor CGT1 common to the eight memory cells. The gate G of the transistor CGT1 and the gates of the access transistors AT are connected to the word line $WL_m$.

The zone B2 comprises eight memory cells C20 to C27 connected to the word line $WL_{m+1}$. Each memory cell comprises conventionally a floating-gate transistor FGT and an access transistor AT. In each memory cell, the transistor FGT has its source S connected to the source line SL, its drain D connected to the source S of the access transistor AT and its gate G connected to the gate control line CGL via a gate control transistor CGT2 common to the eight memory cells. The gate G of the transistor CGT2 and the gates of the access transistors AT are connected to the word line $WL_{m+1}$.

The drains D of the access transistors AT of the cells C15, C16, C17 of the zone B1 are connected respectively to the bit lines $BL_5$, $BL_6$, $BL_7$ and the drains D of the access transistors AT of the cells C20, C21, C22, C23 and C24 are connected respectively to the bit lines $BL_0$, $BL_1$, $BL_2$, $BL_3$, $BL_4$ of the column COL0.

According to the invention, the drains D of the access transistors AT of the cells C10, C11, C12, C13 and C14 of the zone B1 are not connected to the bit lines $BL_0$, $BL_1$, $BL_2$, $BL_3$, $BL_4$ and the drains D of the access transistors AT of the cells C25, C26, C27 of the zone B1 are not connected to the bit lines $BL_5$, $BL_6$, $BL_7$. The absence of the connections are illustrated in the figure by circled crosses.

This architecture of the zones B1, B2 advantageously enables a simultaneous reading of the cells C20, C21, C22, C23, C24, C15, C16, C17 by the sense amplifiers $SA_0$ to $SA_7$ by applying simultaneously a reading voltage Vread on both word lines $WL_m$ and $WL_{m+1}$. Thus, for example, the cells C20, C21, C22, C23, C24 are used for storing 5 configuration bits intended to be loaded in the register CFREG2 during the activation of the memory, while the cells C15, C16, C17 are used for storing 3 condition bits intended to be loaded in the register STREG2 during the activation of the memory.

Table 1 describes the signals applied to the memory array during the simultaneous reading of the zones B1 and B2. In addition, Tables 2, 3, 4 and 5 describe erasing and programming operations of each of the zones B1 and B2. These operations are conventional and are performed distinctly for each of the zones B1 and B2.

In these diverse tables:

V(CGL) is the gate control voltage applied to the line CGL;

$V(WL_m)$ is the voltage applied to the word line $WL_m$;

$V(WL_{m+1})$ is the voltage applied to the word line $WL_{m+1}$;

I(VBL) is the current appearing in a line of bits $BL_0$ to $BL_7$ in a reading phase;

V(BL) is a voltage applied to a line of bits $BL_0$ to $BL_7$ in a programming phase;

V(SL) is the voltage applied to the source line SL;

Vpp is an erasing/programming voltage by a tunnel effect (Fowler-Nordheim effect), typically on the order of 10 to 15 Volts; and Vcc is a supply voltage of the memory, typically on the order of 3 to 5 V.

TABLE 1

| | Simultaneous reading of the zones B1, B2 |
|---|---|
| V (CGL) | Vread |
| V ($WL_m$) | Vcc (selection of the word line) |
| V ($WL_{m+1}$) | Vcc (selection of the word line) |
| I (BL) | Reading current equal to zero or not, according to the value of the bit stored in the floating gate |
| V (SL) | 0 (ground) |

TABLE 2

| | Collective erasing of the memory cells of the zone B1 |
|---|---|
| V (CGL) | Vpp |
| V ($WL_m$) | Vpp (to let the high voltage through to the gates of the transistors FGT via the transistor CGT1) |
| V ($WL_{m+1}$) | Ground |
| V (BL) | High impedance |
| V (SL) | 0 (ground) |

TABLE 3

| | Collective erasing of the memory cells of the zone B2 |
|---|---|
| V (CGL) | Vpp |
| V (WL$_m$) | Ground |
| V (WL$_{m+1}$) | Vpp (to let the high voltage through to the gates of the transistors FGT via the transistor CGT2) |
| V (BL) | high impedance |
| V (SL) | 0 (ground) |

TABLE 4

| | Individual programming of the memory cells of the zone B1 |
|---|---|
| V (CGL) | 0 (ground) |
| V (WL$_m$) | Vpp (to connect to the ground the gates of the transistors FGT via the transistor CGT1 and make the access transistors conductive) |
| V (WL$_{m+1}$) | ground |
| V (BL) | Vpp or high impedance according to the value of the bit to be programmed (voltage defined by the programming latches) |
| V (SL) | high impedance |

TABLE 5

| | Individual programming of the memory cells of the zone B2 |
|---|---|
| V (CGL) | 0 (ground) |
| V (WL$_m$) | Ground |
| V (WL$_{m+1}$) | Vpp |
| V (BL) | Vpp or high impedance according to the value of the bit to be programmed |
| V (SL) | high impedance |

Besides the difference in architecture of the zones B1 and B2 relative to the zones A1 and A2 described in the background section, the memory MEM2 differs from the conventional memory MEM1 in that its activation by the signal CS and the reception of the first clock bits CK (FIG. 2B) cause simultaneous reading of the zones B1 and B2 (Table 1) for loading the special bits of the first and of the second type in their respective registers STREG2 and CFREG2.

The architecture of the zones B1 and B2 is obviously subject to diverse variations within the framework of the present invention. Notably, the memory cells C10 to C14 and C25 to C27 could be omitted since they are not connected to the bit lines BL$_0$ to BL$_7$ and are not accessible for programming or reading. The presence of the non-useful memory cells is justified by the fact that the regions B1 and B2 are formed by standard masks used for the implantation of the memory arrays on a silicon wafer. Only the interconnection mask for forming the connections of these cells to the bit lines (connection of the access transistors) needs to be modified so as not to form these connections at the level of the non-useful cells.

It follows from the foregoing that an essential and sufficient characteristic for simultaneous reading of the special bits of the first and of the second type is that a line of bits connected to a useful memory cell of a special zone is not connected to a useful memory cell of the other special zone.

Figure 5:
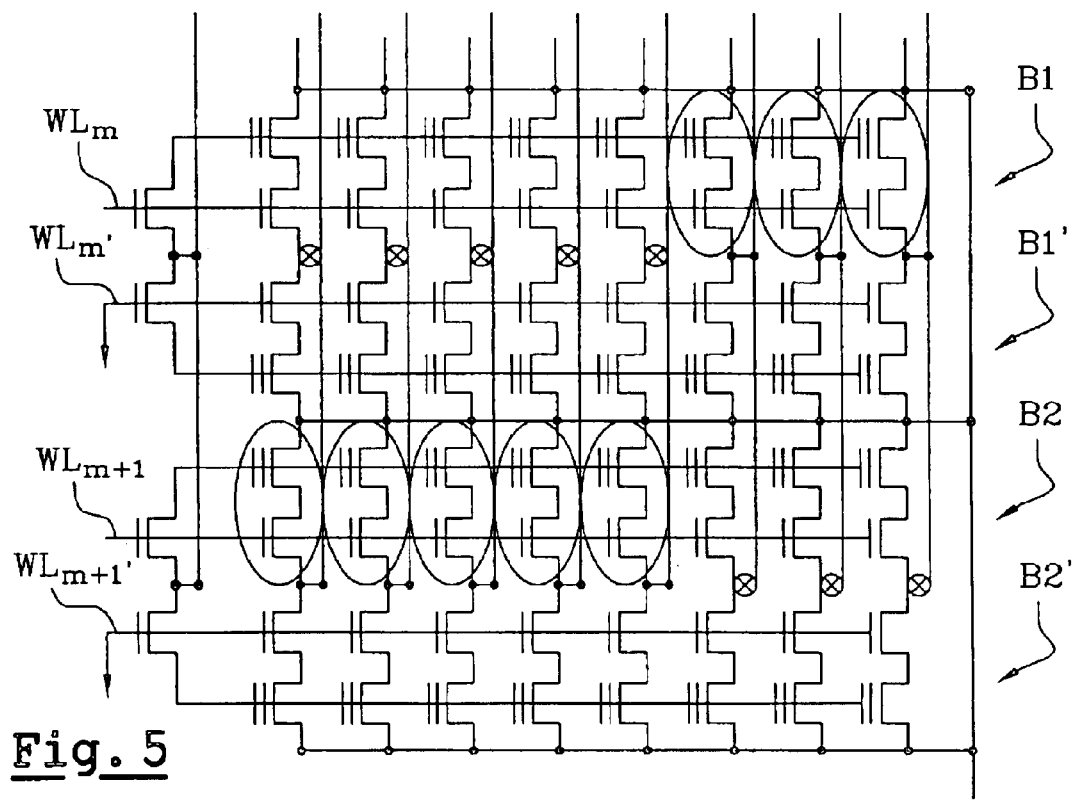
FIG. 5 represents a variation of the two special zones according to the present invention.
Figure 6:
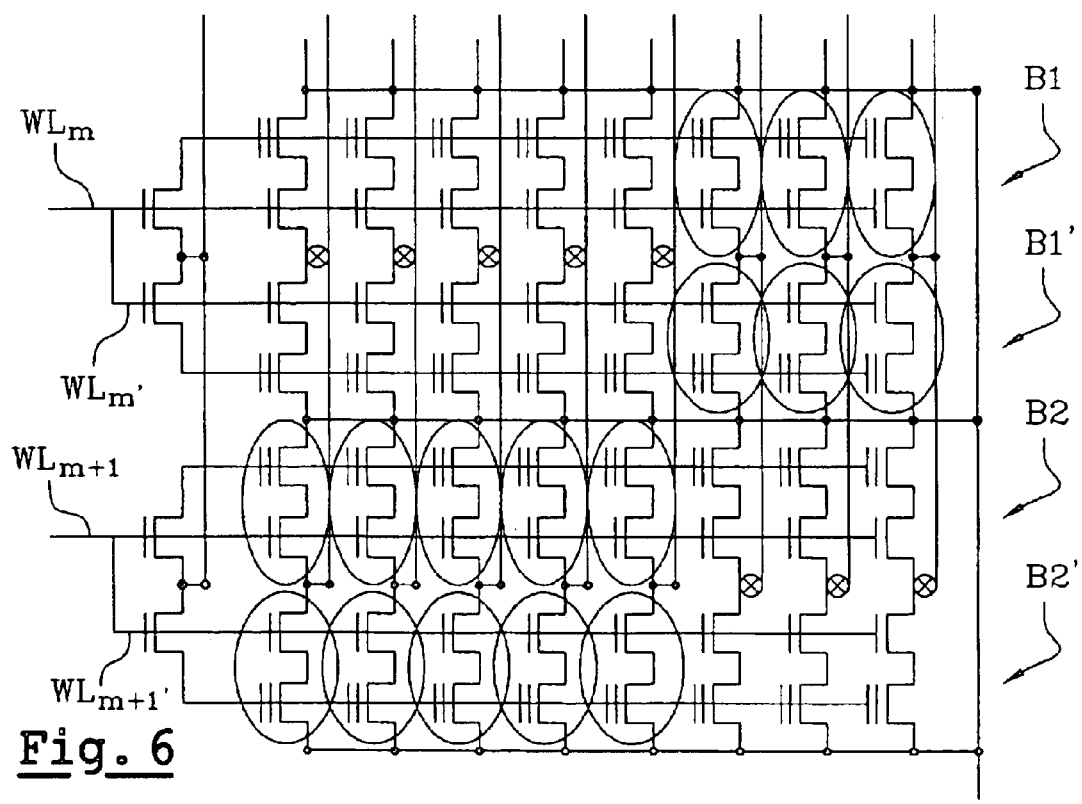
FIG. 6 represents another variation of the two special zones according to the present invention.

FIGS. 5 and 6 represent two alternate embodiments of the zones B1 and B2. In FIG. 5, the zone B1 is associated with a zone B1' that is the image of the zone B1 but whose memory cells are connected to a word line Wl$_m$' which is grounded and is not connected to the decoder WLDEC2. Similarly, the zone B2 is associated with a zone B2' that is the image of the zone B2 but whose memory cells are connected to a word line Wl$_{m+1}$' which is grounded and is not connected to the word line decoder WLDEC2. The memory cells of the zones B1' and B2' are not used and their existence is due to the use of a symmetrical implantation mask, which is well known by those skilled in the art.

The embodiment of FIG. 6 is identical to that of FIG. 5 but the word line WL$_m$' of the zone B1' is connected to the word line WL$_m$ of the zone B1, and the word line WL$_{m+1}$' of the zone B1' is connected to the word line WL$_{m+1}$ of the zone B1. The valid cells of the zones B1' and B2' are in this case read, erased, then programmed at the same time as the corresponding memory cells of the zones B1 and B2. The condition and configuration bits are then subject to a double storing (redundancy), which represents an insurance factor in case of a failing useful memory cell of the zone B1 or of a useful memory cell of the zone B2.

Beyond the initial observation discussed in the background section, according to which the total number of special bits is generally smaller than the number M of bit lines per column, the simultaneous reading process according to the invention can be extended to more than one column, as readily appreciated by those skilled in the art. Let us assume, for example, that the number of special bits of the first type and of the second type is greater than the number M of bit lines per column.

In such a case, both memory zones B1 and B2 must be extended over two columns. While applying the present invention, each semi-memory zone (corresponding to a column) can be read simultaneously so that reading all the special bits calls for two reading operations in total (one per column) instead of four reading operations in the prior art. In such an embodiment, the memory can also be modified to encompass a number of sense amplifiers equal to the number of special bits to be read simultaneously in each column. In such a case, the column decoder COLDEC1 is also modified to enable the connection of the bit lines of both columns with the sense amplifiers when reading the special bits. Therefore, the implementation of the present invention is not limited to the case when the total number of special bits is smaller than the number M.

That which is claimed is:

1. An electrically erasable and programmable memory comprising:

a memory array comprising a plurality of memory cells arranged in rows and columns;

a plurality of word lines connected to the rows of said memory array; and a plurality of bit lines connected to the columns of said memory array;

said memory array comprising at least one first zone for storing a first type of bit, and comprising at least one first row of memory cells connected to a first word line, with N1 memory cells being connected to N1 bit lines of a determined column comprising M bit lines, at least one second zone for storing a second type of bit, and comprising at least one second row of memory cells connected to a second word line, with N2 memory cells being connected to N2 other bit lines of the determined column, and the N1 bit lines not being connected to the at least one second row of memory cells, and the N2 bit lines not being connected to the at least one first row of memory cells.

2. An electrically erasable and programmable memory according to claim 1, wherein N2=M−N1.

3. An electrically erasable and programmable memory according to claim 2, wherein the at least one first row of memory cells comprise M memory cells connected to the first word line, and the at least one second row of memory cells comprise M memory cells connected to the second word line.

4. An electrically erasable and programmable memory according to claim 1, further comprising means for simultaneously applying a reading voltage to the at least one first and second rows of memory cells when reading the first and second types of bits.

5. An electrically erasable and programmable memory according to claim 4, further comprising at least M sense amplifiers for simultaneously reading the N1 memory cells of the at least one first row and the N2 memory cells of the second row.

6. An electrically erasable and programmable memory according to claim 5, further comprising:
a first register for temporary storage of the first type of bits read in the memory cells of the at least one first row; and
a second register for temporary storage of the second type of bits read in the memory cells of the at least one second row.

7. An electrically erasable and programmable memory according to claim 6, further comprising a sequencer for triggering a simultaneous reading of the first and second types of bits during reception of first clock signals.

8. An electrically erasable and programmable memory according to claim 1, wherein the first type of bits comprise condition bits for determining a write-accessibility of said memory array.

9. An electrically erasable and programmable memory according to claim 1, wherein the second type of bits comprise configuration bits for determining a hardware configuration of the memory.

10. An electrically erasable and programmable memory comprising:
a memory array comprising a plurality of memory cells arranged in rows and columns;
a plurality of word lines connected to the rows of said memory array;
a plurality of bit lines connected to the columns of said memory array;
said memory array comprising
at least one first zone for storing a first type of bit, and comprising at least one first row of memory cells connected to a first word line, with N1 memory cells being connected to N1 bit lines of a determined column comprising M bit lines,
at least one second zone for storing a second type of bit, and comprising at least one second row of memory cells connected to a second word line, with N2 memory cells being connected to N2 other bit lines of the determined column,
the N1 bit lines not being connected to the at least one second row of memory cells, and the N2 bit lines not being connected to the at least one first row of memory cells,
a first transistor connected to the determined column and to the at least one first row of memory cells, and
a second transistor connected to the determined column and to the at least one second row of memory cells.

11. An electrically erasable and programmable memory according to claim 10, wherein N2=M−N1.

12. An electrically erasable and programmable memory according to claim 11, wherein the at least one first row of memory cells comprise M memory cells connected to the first word line, and the at least one second row of memory cells comprise M memory cells connected to the second word line.

13. An electrically erasable and programmable memory according to claim 10, further comprising a word line decoder connected to said first and second transistors for simultaneously applying a reading voltage to the at least one first and second rows of memory cells when reading the first and second types of bits.

14. An electrically erasable and programmable memory according to claim 13, further comprising at least M sense amplifiers for simultaneously reading the N1 memory cells of the at least one first row and the N2 memory cells of the at least one second row.

15. An electrically erasable and programmable memory according to claim 14, further comprising:
a first register for temporary storage of the first type of bits read in the memory cells of the at least one first row; and
a second register for temporary storage of the second type of bits read in the memory cells of the at least one second row.

16. An electrically erasable and programmable memory according to claim 15, further comprising a sequencer for triggering a simultaneous reading of the first and second types of bits during reception of first clock signals.

17. An electrically erasable and programmable memory according to claim 10, wherein the first type of bits comprise condition bits for determining a write-accessibility of said memory array.

18. An electrically erasable and programmable memory according to claim 10, wherein the second type of bits comprise configuration bits for determining a hardware configuration of the memory.

19. A process for operating an electrically erasable and programmable memory comprising a memory array comprising a plurality of memory cells arranged in rows and columns; a plurality of word lines connected to the rows; a plurality of bit lines connected to the columns; the memory array comprising at least one first zone comprising at least one first row of memory cells connected to a first word line, with N1 memory cells being connected to N1 bit lines of a determined column comprising M bit lines; at least one second zone comprising at least one second row of memory cells connected to a second word line, with N2 memory cells being connected to N2 other bit lines of the determined column; and the N1 bit lines not being connected to the at least one second row of memory cells, and the N2 bit lines not being connected to the at least one first row of memory cells, the process comprising:
storing a first type of bit in the at least one first zone; and
storing a second type of bit in the at least one second zone.

20. A process according to claim 19, wherein N2=M−N1.

21. A process according to claim 20, wherein the at least one first row of memory cells comprise M memory cells connected to the first word line, and the at least one second row of memory cells comprise M memory cells connected to the second word line.

22. A process according to claim 19, further comprising simultaneously applying a reading voltage to the at least one first and second rows of memory cells when reading the first and second types of bits.

23. A process according to claim 22, wherein the memory further comprises at least M sense amplifiers for simultaneously reading the N1 memory cells of the at least one first row and the N2 memory cells of the at least one second row.

24. A process according to claim 23, further comprising:

temporarily storing the first type of bits read in the memory cells of the at least one first row; and temporarily storing the second type of bits read in the memory cells of the at least one second row.

25. A process according to claim 24, wherein the memory further comprises a sequencer for triggering a simultaneous reading of the first and second types of bits during reception of first clock signals.

26. A process according to claim 19, wherein the first type of bits comprise condition bits for determining a write-accessibility of said memory array.

27. A process according to claim 19, wherein the second type of bits comprise configuration bits for determining a hardware configuration of the memory.

* * * * *